(12) United States Patent
Kanga et al.

(10) Patent No.: US 6,806,018 B2
(45) Date of Patent: Oct. 19, 2004

(54) PROCESSLESS DIGITALLY IMAGED PRINTING PLATE USING MICROSPHERES

(75) Inventors: Rustom Sam Kanga, Marietta, GA (US); Daniel Rosen, Acworth, GA (US)

(73) Assignee: MacDermid Graphic Arts, Inc., Atlanta, GA (US)

(*) Notice: Subject to any disclaimer, the term of this patent is extended or adjusted under 35 U.S.C. 154(b) by 175 days.

(21) Appl. No.: 10/105,898

(22) Filed: Mar. 25, 2002

(65) Prior Publication Data

US 2003/0180636 A1 Sep. 25, 2003

(51) Int. Cl.[7] .................................................. G03F 7/11
(52) U.S. Cl. ................. 430/138; 430/273.1; 430/281.1; 430/286.1; 430/306; 430/309; 430/348; 430/394; 430/494; 430/944; 430/945; 101/453; 101/463.1
(58) Field of Search ....................... 430/138, 270.1, 430/271.1, 273.1, 281.1, 286.1, 300, 306, 309, 348, 394, 494, 326, 330, 944, 945; 101/453, 463.1

(56) References Cited

U.S. PATENT DOCUMENTS

| | | | |
|---|---|---|---|
| 4,045,231 A | 8/1977 | Toda et al. ..................... 96/115 |
| 4,177,074 A | 12/1979 | Proskow ..................... 430/286 |
| 4,427,759 A | 1/1984 | Gruetzmacher et al. .... 430/273 |
| 4,460,675 A | 7/1984 | Gruetzmacher et al. .... 430/300 |
| 4,517,279 A | 5/1985 | Worns ......................... 430/286 |
| 4,622,088 A | * 11/1986 | Min |
| 4,771,079 A | 9/1988 | Melber ......................... 521/54 |
| 5,223,375 A | 6/1993 | Berrier et al. ............... 430/281 |
| 5,364,683 A | 11/1994 | Flint et al. .................. 428/141 |
| 5,364,741 A | 11/1994 | Huynh-Tran et al. ........ 430/300 |
| 5,925,500 A | 7/1999 | Yang et al. .................. 430/300 |
| 5,976,765 A | 11/1999 | Kumpfmiller et al. ....... 430/306 |
| 6,017,679 A | 1/2000 | Chase et al. ............. 430/286.1 |
| 6,071,567 A | 6/2000 | Castelli et al. ............ 427/389.9 |
| 6,090,529 A | 7/2000 | Gelbart ........................ 430/306 |
| 6,159,659 A | 12/2000 | Gelbart ........................ 430/306 |
| 6,171,758 B1 | 1/2001 | Bhateja et al. ............ 430/271.1 |
| 6,287,638 B1 | 9/2001 | Castelli et al. ............... 427/381 |
| 6,551,759 B2 * | 4/2003 | Daems et al. |

FOREIGN PATENT DOCUMENTS

| | | |
|---|---|---|
| EP | 0 982 124 A2 | 8/1999 |
| WO | WO 01/18604 A2 | 3/2001 |
| WO | WO 01/88615 A1 | 11/2001 |

* cited by examiner

Primary Examiner—Mark F. Huff
Assistant Examiner—Barbara Gilliam
(74) Attorney, Agent, or Firm—Carmody & Torrance LLP

(57) ABSTRACT

A laser imageable flexographic printing plate and a method of making the laser imageable flexographic printing plate using a collapsible UV cross-linkable material comprising a UV-curable elastomer, an IR dye, and microspheres is disclosed. The collapsible UV cross-linkable material is mixed together and then extruded to form a printing plate. An IR laser is used to collapse and melt the collapsible UV cross-linkable material to form a relief image on the printing plate. The printing plate is thereafter UV cured by face exposure to crosslink and cure the formed relief image. The invention addresses a market need for eliminating chemical processing of printing plates, thus going from plate to press much more quickly. The printing plate may also contain a thin layer of a high-density non-collapsible UV-curable elastomer between the collapsible layer and the cover sheet of the plate which acts as the print surface in the final plate.

48 Claims, 1 Drawing Sheet

PROCESSLESS DIGITALLY IMAGED PRINTING PLATE USING MICROSPHERES

FIELD OF THE INVENTION

The present invention relates to photosensitive elastomeric compositions used to prepare digitally imaged relief-printing plates without the need for an interim process step.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only be means of flexography. Flexographic printing plates are relief plates with image elements raised above open areas. Such plates offer a number of advantages to the printer, based chiefly on their durability and the ease with which they can be made.

A typical flexographic printing plate as delivered by its manufacturer, is a multilayered article made of, in order, a backing or support layer, one or more unexposed photocurable layers, a protective layer or slip film, and a cover sheet. The backing layer lends support to the plate. It is typically a plastic film or sheet about 5 mils or so thick, which may be transparent or opaque. Polyester films, such as polyethylene terephthalate film, are examples of materials that can be suitably used as the backing. When only a single photocurable layer is present, it may be anywhere from about 25–275 mils thick, and can be formulated from any of a wide variety of known photopolymers, initiators, reactive diluents, etc. In some plates, there is a second photocurable layer (referred to as an "overcoat" or "printing" layer) atop this first, base layer of photocurable material. This second layer usually has a similar composition to the first layer, but is generally much thinner, being on the order of less than about 10 mils thick. The slip film is a thin (0.1 to 1.0 mils) sheet, which is transparent to UV light, which protects the photopolymer from dust and increases its ease of handling. The cover sheet is a heavy, protective layer, typically polyester, plastic, or paper. Typical prior art methods for making flexographic printing plates may be found, for example, in U.S. Pat. Nos. 4,045,231, 5,223,375 and 5,925,500, the teachings of which are incorporated by reference herein in their entirety.

It is highly desirable in the flexographic prepress printing industry to eliminate the need for chemical processing of plates in developing relief images, in order to go from plate to press more quickly. An early attempt to reduce solvents, and the inherently longer drying required for solvent developing was the aqueous developable flexographic printing plate as taught in U.S. Pat. Nos. 4,177,074, 4,517,279, 5,364,741 and 6,017,679, the teachings of which are herein incorporated by reference in their entirety. However, the use of water to develop relief is still a "processing" step. In addition, water developable printing plates have inherent disadvantages, such as limited print performance and the generation of wastewater.

Thermal mass transfer plates, such as DuPont Cyrel® FAST™, are gaining popularity because they are chemical free. In the case of the FAST™ approach, the thermal process of removing the uncured non-image areas of the photopolymer is carried out after cross-linking the image areas of the plate. This approach is demonstrated in U.S. Pat. No. 6,171,758, and in Patent Nos. WO0118604 and WO0188615, the teachings of which are herein incorporated by reference in their entirety. Since the photopolymer is "dense", removing of the uncured non-image areas takes a substantial amount of time to achieve. Customers must also invest in a special proprietary processor.

Laser-engraving systems from Fulflex and BASF (called LEP) are also process-free. An example of this technology is found in Patent No. EP0982124A2 the teachings of which are herein incorporated by reference in their entirety. In the BASF and ZED/Fulflex approach, the photopolymer/rubber is cured or cross-linked prior to the engraving step. Once again, because of the high density of these materials, the thermal engraving step is long and tedious. Additionally, high resolution is difficult to achieve. Thus, the disadvantage of prior art engraved plates is a combination of limited resolution and throughput.

Directly engraving a relief plate with a laser is a highly desirable concept. However, $CO_2$ engraving lasers lack beam resolution and cause anomalies due to heat dissipation. The resolution of such systems is limited to well below 133 lines per inch (LPI) on a practical basis. Infrared (IR) lasers such as Nd-YAG lasers are extremely high in resolution and are precisely controlled. However, these lasers lack the necessary power and reactivity to engrave conventional photopolymers and may be too slow due to mass transfer limitations in dense "cured" photopolymer or rubber systems.

A solution to the problem may lie in the use of a UV-curable thermoplastic elastomer that contains micro-bubbles. The composition is essentially a photocurable elastomeric uncured foam that is laden with a dye that is both IR absorbing and UV transmissive. As the IR laser strikes the dye, it transfers IR energy into heat, causing "laser collapse" of the micro-bubbles or microspheres. Because the photocurable elastomeric material consists of foam cells which are only microns in size, the ablation-to-depth process can occur much more quickly, using much lower energy than is required in true mass transfer systems such as mask ablation or polymer engraving. In addition, the lower density and the corresponding lower heat energies involved in this process act to prevent conductance of heat energy to adjoining cells, thus limiting thermal damage and having the potential for higher resolution than traditional laser engraving. After all of the non-printing (relief) areas have been laser collapsed, there may be an additional process step to laser collapse the top layer to form a denser printing surface. This denser printing surface can also be created by a "bump" UV-exposure in concert with the regular exposure. A "bump" or "flash" exposure refers to a quick exposure, generally of less than about 1 second. The photopolymer is then flood UV-exposed to cross-link the formed image for enhanced physical properties. Finally, the process may contain a detacking step.

The advantage of this "low density" approach is that it may be used in any of the conventional plate-setters in the industry, with only a change in the software that is used to control the energy density; no major investment in hardware is needed. The disadvantage of UV-imaging through a "foam" is obviated because the imaging is done by the interaction of the IR laser with the microspheres. UV-curing is used simply to set the image in place. Furthermore, in using this process, one avoids the washout process step, and hence has the workflow advantage of going from the plate to press much more quickly than in conventional flexographic printing plates, while at the same time reducing solid waste generation.

U.S. Pat. No. 6,159,659 and U.S. Pat. No. 6,090,529, both to Gelbart, the teachings of which are incorporated herein by reference in their entirety, disclose methods for directly creating a raised image on a flexographic printing surface. These patents disclose laser ablation of an intermediate layer that comprises an elastomer and a high concentration of plastic or glass microballoons, in order to form recessed areas on the surface. In addition, these patents disclose controlling the intensity of the laser beam and the dwell time of the laser beam in each spot so that the laser power applied to each part of the surface is sufficient to cause localized melting of the intermediate layer. The dwell time is sufficiently long so as to produce viscous flow of the melted material, while the laser intensity is insufficient to cause complete ablation of the intermediate layer. In one example, the printing plate is made from a closed-cell black polyurethane foam, where the foam has a density of about 10% that of solid polyurethane. U.S. Pat. No. 6,159,659 further discloses that when the plate is "cut" or ablated, with a laser at the operating wavelength, the cutting action is self-limiting because of the insensitivity of the backing at the operating wavelength, which avoids damage to the backing.

The present invention comprises a collapsible photosensitive elastomer composition comprising a UV-curable elastomer, an infrared dye, and microspheres. In contrast, the U.S. Pat. No. 6,090,529 and the U.S. Pat. No. 6,159,659 do not disclose a photosensitive elastomer and do not disclose crosslinking the composition of the formed image in order to enhance the physical properties of the printing plate. In addition, the U.S. Pat. No. 6,090,529 and the U.S. Pat. No. 6,159,659 do not disclose how the foam intermediate layer behaves as a printing plate. The patents disclose that the pigment/dye is carbon-based, which is not suitable for use in the present invention because it will interfere with the photocurable aspects of the invention.

The present invention relates to a UV cross-linkable raw material that is cured after laser imaging for added physical strength necessary for press life durability. The present invention also advocates the use of microspheres, which will give excellent image fidelity and consistency. As explained in more detail below, the choice of the microspheres and the laser dye is key to the success of this invention.

The new concept of the present invention addresses the market need for eliminating the need for chemical processing of printing plates, by using a very low-density photopolymer plate that is impregnated with infrared (IR) sensitive micro-bubbles, that collapse when irradiated with an IR laser. Subsequently the photopolymer can be UV-cured to cross-link the material for enhanced physical properties.

SUMMARY OF THE INVENTION

It is an object of the present invention to provide a printing plate comprising a collapsible UV-curable elastomer composition comprising a UV-curable elastomer, an infrared dye, and microspheres and a method for making a printing plate, which does not require the use of any interim process steps.

Another aspect of the invention is to provide a method of making a laser imageable printing plate using a collapsible UV cross-linkable material that comprises microspheres, so as to decrease the final density of the plate formulation.

The objects of the invention can be accomplished by providing a digitally imaged relief printing plate and a method of making the digitally imaged relief-printing plate comprising the steps of a) extruding a collapsible UV-curable elastomer composition comprising (i) a UV-curable elastomer, (ii) an infrared dye, and (iii) microspheres, between a cover sheet and a backing sheet to form a printing plate;

b) exposing the collapsible UV-curable elastomer composition through the backing sheet to establish a floor layer;

c) removing the cover sheet from the printing plate;

d) using a laser to collapse and melt portions of the collapsible UV-curable elastomer to form a relief image on the printing plate; and e) UV-curing said UV-curable elastomer by face exposure to crosslink said formed relief image; and f) post-curing and detacking the plate, if required.

Additional features and advantages of the present invention will become apparent through the disclosure described below.

DETAILED DESCRIPTION OF THE INVENTION

Figure 1:
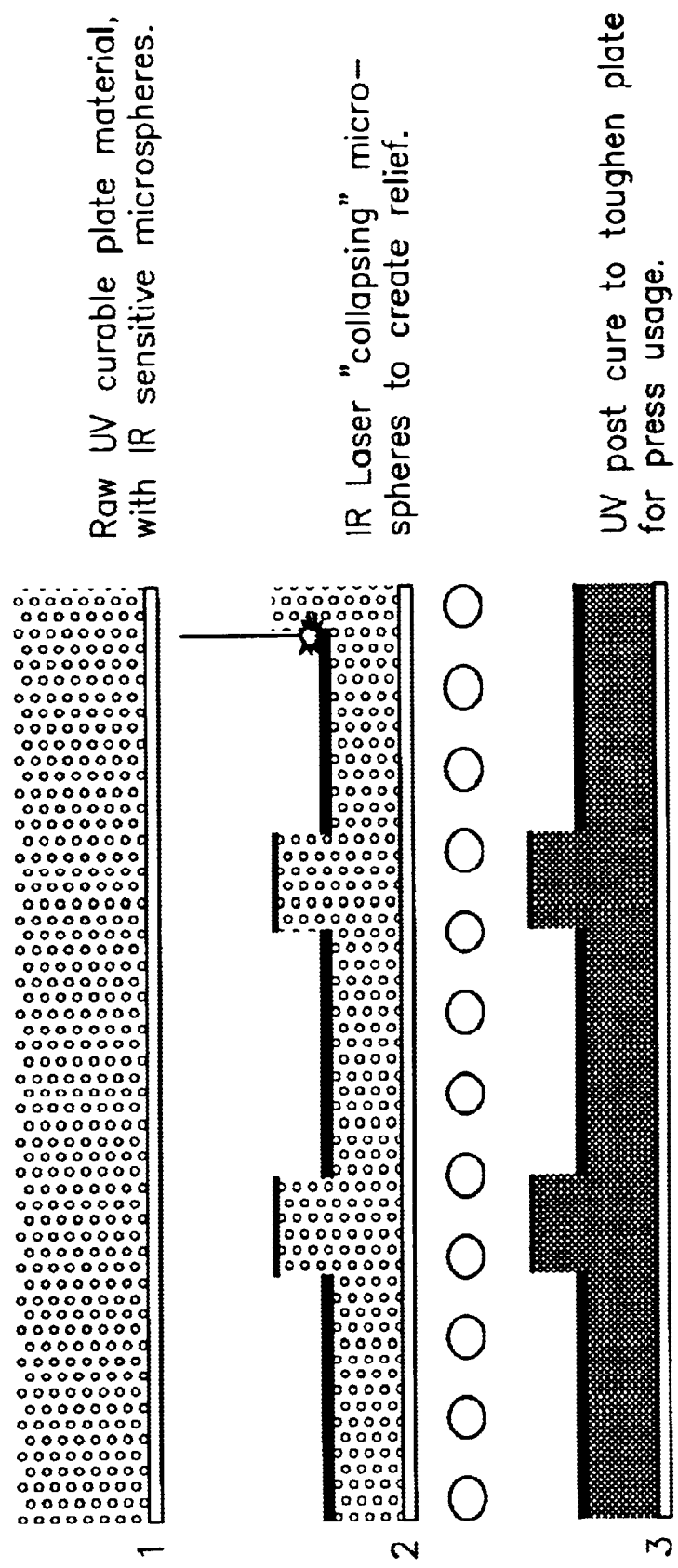
FIG. 1 depicts a printing plate manufactured in accordance with one aspect of the present invention.

The present invention includes a laser-imaged printing plate and a method of making the laser-imaged printing plate without the need for chemical processing of the plate. The plate may further comprise a thin layer of a non-collapsible UV-curable elastomer between the collapsible layer and the cover sheet of the plate, which acts as the print surface in the final plate.

Printing Plate Construction

A collapsible UV-curable elastomer composition is formed by mixing together a UV-curable elastomer, an infrared dye, and microspheres. Next, the collapsible UV-curable elastomer is extruded between a cover sheet and a backing sheet to form a printing plate. The cover sheet may contain a release agent to facilitate the easy removal of the coversheet for mounting onto the plate setter.

The collapsible UV-curable elastomer composition is back exposed through the backing sheet to establish a floor layer. This is a blanket exposure to actinic radiation through the support, and is used to create a shallow layer of polymerized material, or a floor, on the support side of the photopolymerizable layer. The floor provides improved adhesion between the photopolymerizable layer and the support and establishes the depth of the plate relief.

The cover sheet is then removed from the printing plate and the printing plate is mounted on a plate setter. A digital file is transferred from a computer onto the printing plate. An infrared laser, operating at a wavelength of 830 nm or 1064 nm, is used to collapse and melt the UV-curable elastomer to form a relief image on the printing plate. The UV-curable elastomer is then face exposed to crosslink and cure the formed image. Most flexographic printing plates are uniformly face exposed to ensure that the photopolymerization process is complete and that the plate will remain stable during printing and storage.

Finally, the plate may be subjected to an optional detacking step. Detackification is an optional post-development treatment that can be applied if the surface is still tacky. Tackiness can be eliminated by any methods known in the art.

After the face exposure and optional detacking steps, the plate is ready for printing on the press. The plate is cured and post-cured to hold 1% dots at 133 lines per inch (LPI). LPI is a measure of screen frequency in flexography, where the higher the frequency, the finer the print. Thus, rough printing, such as on corrugated cardboard, typically uses a line screen of about 65 LPI, and finer printing, such as on tags or labels and packaging generally uses much higher line screens, such as 120 LPI and higher.

The various components that make up the present invention are explained in detail below. The formulations of the invention are mixed in a sigma mixer and extruded in plate form on a single screw extruder. Alternatively, the formulations may be extruded in a twin-screw extruder. The choice of the microspheres governs the manufacturing method, while the choice of the IR-dye governs the operating wavelength of the plate-setter.

The normal plate construction comprises, from the top, a polyethylene terephthalate coversheet with a release coating or a slip film coating, a collapsible UV-curable elastomer layer and a polyethylene terephthalate backing. Depending on the application, other plate constructions may also be employed.

The method may include a further step of creating a denser printing layer on the surface of the flexographic printing plate. This denser printing layer may be built into the plate construction for example by adding a thin layer of a non-collapsible UV-curable elastomer or a "cap" between the collapsible layer and the plate surface. This denser non-collapsible layer may have a similar or the same composition as the collapsible layer, but without the addition of the microspheres. The non-collapsible layer may also be similar to or the same as typical cap layers normally used in conventional capped plates, such as MacDermid's Flexlight® EPIC. Examples of the cap layer are well known in the art and may be found, for example, in U.S. Pat. Nos. 4,427,759, 4,460,675, and 5,976,765, the subject matter of which is herein incorporated by reference in their entirety.

In the alternative, the method may include a step of laser collapsing a top layer of the formed image to form a denser printing surface. This step may occur simultaneously with the formation of the relief image by bump exposure, or may alternatively occur in a separate step immediately after formation of the relief image.

FIG. 1 depicts several stages in the manufacture of the printing plate of the present invention. The first stage (1) shows a raw printing plate, comprising a collapsible UV-curable elastomer layer that contains a UV-curable elastomer, an IR dye, and microspheres; the second stage (2) shows the IR laser collapsing the microspheres contained in the collapsible UV-curable elastomer layer to create the relief image of the printing plate; and the third stage (3) demonstrates the UV curing and post-curing steps that toughen the printing plate for press usage.

UV Curable Elastomer

The UV curable elastomer of the invention comprises:
(1) a binder;
(2) a plasticizer;
(3) a photopackage, including UV-curable monomers and photoinitiators; and
(4) other additives.

Any of the known photocurable compositions can be used in the present invention. The binder lends structural stability to the plate. Suitable binders include styrene-butadiene-styrene copolymers, thermoplastic elastomers, thermoplastic polyurethanes, styrene-isoprene-styrene copolymers, and polyurethanes. Preferred binders include triblock copolymers of styrene-butadiene-styrene and styrene-isoprene styrene. Kraton™D1102, a styrene-butadiene-styrene copolymer, and Kraton™D1107, a styrene-isoprene-styrene copolymer, manufactured by Kraton Polymers are especially preferred.

Because the melt flow of the elastomer composition is crucial, it is imperative that the binder demonstrates reasonably high melt flow indices (MFI's ). MFI's between about 5 g/10 minutes to about 20 g/10 minutes (200° C., 5 Kg) are preferred, and MFI's of about 10–11 g/10 minutes are more preferred. The lower limit is to facilitate the ease of laser collapse, while the upper limit in the MFI is for the strength and integrity of the final plate.

The function of the plasticizer is to create a medium in which the melted polymer has a reasonably low viscosity so that a viscous flow occurs during the laser collapse process. The plasticizer should be compatible with the binder, decrease the Shore A or durometer hardness, and decrease the viscosity of the melt at elevated temperatures, and at the same time should be able to interact with the binder so that it is non-tacky at ambient temperatures. Suitable plasticizers include oligomeric polyisoprenes and polybutadienes. One example of a plasticizer usable in the present invention is Shellflex™6371, a naphthenic/paraffinic oil specifically designed for rubber and plastics, manufactured by Shell Oil. The ratio of plasticizer to binder is critical to the success of the invention. If too much binder is used in the composition, the melt viscosity and Shore A hardness will be too high and unusable in the invention. Too much plasticizer will produce a weak composition.

The photopackage comprises typical UV-curable monomers and photo initiators. Difunctional and trifunctional monomers give good cross-link densities.

Some examples of difunctional and trifunctional monomers that are usable in the invention include acrylates such as trimethylolpropane triacrylate, hexanediol diacrylate (HDDA), 1,3-butylene glycol diacrylate, diethylene glycol diacrylate, 1,6-hexanediol diacrylate, neopentyl glycol diacrylate, polyethylene glycol-200 diacrylate, tetraethylene glycol diacrylate, triethylene glycol diacrylate, pentaerythritol tetraacrylate, tripropylene glycol diacrylate, ethoxylated bisphenol-A diacrylate, trimethylolpropane triacrylate, di-imethylolpropane tetraacrylate, triacylate of tris (hydroxyethyl) isocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate (TMPTMA), diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate, urethanemethacrylate or acrylate oligomers and the like which can be added to the photopolymerizable composition to modify the cured product. Monoacrylates such as cyclohexyl acrylate, isobornyl acrylate, lauryl acrylate and tetrahydrofurfuryl acrylate and the corresponding methacrylates are also operable as the UV-curable monomer in the invention.

Photoinitiators for the UV-curable elastomer composition include the benzoin alkyl ethers, such as benzoin methyl ether, benzoin ethyl ether, benzoin isopropyl ether and benzoin isobutyl ether. Another class of photoinitiators are the dialkoxyacetophenones, exemplified by 2,2-dimethoxy-2-phenylacetophenone, i.e., Irgacure® 651 (available from Ciba-Geigy, Hawthorne, N.Y.); and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to, benzophenone, acetophenone, o-methoxybenzophenone, acenaphthenequinone, methyl ethyl ketone, valerophenone, hexanophenone, alpha-phenylbutyrophenone, p-morpholinopropiophenone, dibenzosuberone, 4-morpholinobenzophenone, 4-morpholinodeoxybenzoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracene-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7.12 dione, etc. Phosphines such as triphenylphosphine and tri-o-tolylphosphine are also operable herein as photoinitiators. Benzophenone-based initiators are preferred. An example that is commercially available is Irgacure® 651.

To inhibit premature crosslinking during storage of the prepolymer containing compositions of this invention, thermal polymerization inhibitors and stabilizers may be added. Such stabilizers are well known in the art, and include, but are not limited to, hydroquinone monobenzyl ether, methyl hydroquinone, amyl quinone, amyloxyhydroquinone, n-butylphenol, phenol, hydroquinone monopropyl ether, phenothiazine and nitrobenzene, and mixtures thereof. These stabilizers are effective in preventing crosslinking of the prepolymer composition during preparation, processing and storage. Irganox® 1010, available from Ciba Specialty Chemicals, has been found to work well in the compositions of the instant invention.

Other additives that may be added to the elastomer to enhance the properties of the composition include extrusion aids and antioxidants. Suitable extrusion aids include calcium stearate. Suitable antioxidants include alkylated phenols, alkylated bisphenols, polymerized trimethyldihydroquinone, and dilauryl thiopropionate, may also be added. Beta-hydroxy toluene (BHT) is especially preferred.

UV light absorbers, or UV light stabilizers, may be added to the elastomer to adjust the photospeed and, therefore, exposure latitude of the elastomer material. Numerous materials will be apparent to those skilled in the art. Examples of light stabilizer classes usable in the compositions of the instant invention include hydroxy-benzophenones, 2-hydroxyphenyl benzotriazoles, hindered amines and organic nickel compounds. In addition, salicylates, cinnamate derivatives, resorcinol monobenzoates, oxanilides, and p-hydroxy benzoates may also be used. Tinuvin® 1130, a substituted hydroxphenyl benzotriazole, available from Ciba-Geigy Corp., has been found to work especially well.

Microspheres

The function of the microspheres in the UV-curable elastomer composition is to decrease the final density of the plate formulation. The microspheres allow for plate manufacturing under extruder conditions, while at the same time allowing the UV-curable elastomer composition to collapse and melt when heated to laser imaging temperatures. During the collapsing step, hydrocarbon gas trapped in the shell of the microspheres is released.

The choice of the microspheres is important to the success of this invention. The microspheres should be stable during the manufacturing process of the plate, yet able to collapse during the laser-imaging step. The microsphere should also be stable to solvents and monomers normally encountered in typical printing conditions. The size of the microspheres governs the "pixel" size.

For this application, there are at least two types of commercially available microspheres that may be used, unexpanded microspheres and expanded microspheres. While both types are usable in the invention, the unexpanded version offers advantages of better control of the final particle size as well as increased ease of use. The weight percent of the microspheres in the composition depends on the final relief desired and typically ranges from about 1% to about 15% by weight of the photopolymer formulation.

Regardless of whether the microsphere is expanded or unexpanded, the microspheres generally consist of a thermoplastic shell encapsulating a hydrocarbon. The shell of the microsphere is typically a copolymer of acrylonitrile and vinylidene chloride or methacrylonitrile, and the hydrocarbon inside the shell is typically isobutane or isopentane. There are a number of commercial sources for thermoplastic microspheres. EXPANCEL® is a trade name for microspheres available from Noble Industries. Dualite and Micropearl polymeric microspheres are available from Pierce & Stevens Corporation.

With respect to the unexpanded microspheres, when the thermoplastic shell is heated, it softens and at the same time the pressure of the hydrocarbon increases, causing the shell to stretch and expand. When the heat is removed, the shell stiffens and the microspheres remain in their new expanded form. Typically, the unexpanded microspheres are added with the photopolymer elastomer composition, and the expansion coaxed during the extrusion step in a twin-screw extruder. The temperature reached during the extrusion step governs the size of the microspheres. Care is taken to avoid temperatures above the maximum temperature of expansion of the microspheres ($T_{max}$), above which the microspheres start to contract. Microspheres are thus chosen having a $T_{max}$ that is much higher than the manufacturing temperature of the elastomeric composition. Unexpanded microspheres typically show particle size increase from about 6–16 $\mu$m to about 20–40 $\mu$m, with a corresponding density change from 1.1 g/cm$^3$ to 0.04–0.06 g/cm$^3$.

Table 1 summarizes typical properties of various unexpanded microspheres available from Noble Industries. In the microsphere formulations shown, the density changes from 0.8–1.0 g/cm$^3$ in the unexpanded form to approximately 0.13–0.065 g/cm$^3$ in the expanded form, depending on the final particle size achieved.

TABLE 1

Typical Properties of Commercially Available Unexpanded Microspheres from Noble Industries

| Expancel DU | Particle size | T-start, ° F. | T-max, ° F. | Density (g/cm$^3$) |
|---|---|---|---|---|
| 551 DU 20 | 6–9 $\mu$m | 199–208 | 264–279 | 0.06 |
| 551 DU 40 | 10–16 $\mu$m | 199–208 | 264–279 | 0.04 |
| 051 DU 40 | 9–15 $\mu$m | 223–232 | 280–297 | 0.06 |

TABLE 1-continued

Typical Properties of Commercially Available Unexpanded Microspheres from Noble Industries

| Expancel DU | Particle size | T-start, ° F. | T-max, ° F. | Density (g/cm³) |
|---|---|---|---|---|
| 009 DU 80 | 18–24 μm | 237–255 | 329–356 | 0.06 |
| 091 DU 40 | 10–16 μm | 234–252 | 361–379 | 0.04 |

Table 2 summarizes typical properties of various unexpanded microspheres available from Pierce & Stevens Corporation. In the microsphere formulations shown, the density changes from 0.8–1.0 g/cm³ in the unexpanded form to approximately 0.02–0.03 g/cm³ in the expanded form, depending on the final particle size achieved.

TABLE 2

Typical Properties of Commercially Available Unexpanded Microspheres from Pierce and Stevens

| Micropearl | Density (g/cm³) (Before Expansion) | T-start, ° F. | T-max, ° F. | Density (g/cm³) (After Expansion) |
|---|---|---|---|---|
| F50D | 0.8–1.0 | 212 | 284 | 0.03 |
| F46D1 | 0.8–1.0 | 212 | 284 | 0.02 |
| F80D1 | 0.8–1.0 | 284 | 320–338 | 0.02 |

Expanded microspheres may also be usable in the method of the present invention. In this instance, a sigma-mixing step followed by single screw extrusion is employed. Table 3 summarizes typical properties of various expanded microspheres available from Noble Industries.

TABLE 3

Typical Properties of Commercially Available Expanded Microspheres from Noble Industries

| Expancel DE | Particle size | T-max, ° F. | Density (g/cm³) |
|---|---|---|---|
| 551 DE 20 d60 | 15–25 μm | 264–279 | 0.06 |
| 551 DE 40 d42 | ~40 μm | 264–279 | 0.04 |
| 051 DE 40 d60 | 20–40 μm | 280–297 | 0.06 |
| 009 DE 80 | ~80 μm | 329–356 | 0.06 |
| 091 DE 40 d30 | ~40 μm | 361–379 | 0.03 |

IR Dye

The UV curable elastomers and even the microspheres are typically not very sensitive to IR radiation. To increase the sensitivity of the photopolymer elastomer composition to the IR radiation of the lasers in the plate-setters, an IR dye is required. Thus, the main function of the IR dyes is to make a normally IR transmissive compound IR absorbing. As the IR laser strikes the dye, it transfers the energy from IR-photons into heat, causing "laser-collapse" of the microbubbles or microspheres. During the laser-collapsing process step, very little, if any of the elastomer mass is removed. Upon collapsing, the microspheres release the trapped hydrocarbon gases, which are vented out. As the material consists of foam cells which are microns in size, the ablation-to-depth process can occur much more quickly, using much lower energy, than is required in true mass transfer systems such as mask ablation or polymer engraving.

If the IR dyes were also UV absorbing, it would not be possible to through-cure the plate, and the plate would be rendered unusable. Therefore, one of the key requirements of the laser dye is that it is essentially transmissive in the UV regime between 350–400 nm, so that it will not interfere during the subsequent UV-curing step. Typically, the laser dyes are essentially monochromatic, and the choice of the plate-setter laser wavelength, either 830 nm or 1064 nm, would accordingly govern the choice of the dye. The level of dye loadings depends on the extinction coefficient of the dye at the operating wavelength, but generally ranges from about 0.01% to about 5% by weight of the photopolymer formulation.

Several IR-absorbing/UV-transmissive dyes are commercially available. ADS830A and ADS1060A (available from American Dye Source, Inc.) are examples of dyes usable in the present invention. Other dyes are available from Lambda Physik, Exciton, Inc., Acros Organics USA, Clarion Corp., and Zeneca, Inc.

Laser Imaging

One of the major advantages of the concept of the present invention is that most customers of traditional digital flexography can practice the invention with only a change in software. Unlike other processless printing plates of the prior art, no major investments in hardware are needed.

There are 2 types of plate setters that are generally in use, which operate at either 830 nm or 1064 nm. Because of the monochromatic nature of the IR dye, each of the different plate setters needs a different dye, and hence plates with different formulations.

The laser is employed to precisely collapse the UV-curable elastomer at specific points, thus creating an image by virtue of laser collapsed and uncollapsed areas on the printing plate. The laser collapse approach has entirely different, and lower power density needs, than are currently employed in laser ablation or laser engraving. In fact, above a certain power density the material will tend to ablate or degrade and care will need to be taken to stay below this threshold power density.

A combination of laser power, laser spot size and dwell time are optimized to produce the preferred range of energy and power density. Changes in the commercial plate-setter software may be necessary for this application.

This invention is further described by the following examples, which should be taken as illustrative only and not limiting in any regard.

EXAMPLE 1

Preparation of a Processless Flexographic Plate Using Unexpanded Microspheres Sensitive to 830 nm Lasers A printing plate is manufactured according to the composition listed in Table 4, using unexpanded microspheres (Expancel DU microspheres). The ingredients are mixed in a Sigma mixer, and the temperature of the mixer is slowly and gradually increased, until it reaches the "optimum" expansion temperature for the unexpanded microspheres to increase their volume. The optimum expansion temperature is determined through routine experimentation, and depends on the particular type and size of unexpanded microspheres that are used. Care is taken not to exceed the "maximum" expansion temperature so as to avoid microsphere collapse. The composition is hot-pressed between 2 clear polyethylene terephthalate sheets (PETs) at a temperature that is below the maximum expansion temperature of the microspheres. One of the two PETs has a slip film or release coating to facilitate easy removal.

Alternately and preferably, the plate is manufactured in a twin-screw extruder. In the twin-screw extruder, the ingredients listed in Table 4 are partitioned into solids and pre-mixes. The solid and liquid streams are mixed initially at a temperature below the expansion temperature of the microspheres for complete mixing. The temperature of the barrel zones is gradually increased to create in situ expansion. The compound is then extruded and calendared to gage between two PETs, one of which has a slip film or release coating to facilitate easy removal.

The plate is back-exposed through the backing, the coversheet is removed and discarded and the plate is then mounted on a commercially available 830 nm flexographic plate-setter such as Creo's ThermoFlex® 5280. The digital file from the computer is transferred onto the plate. In the areas where the laser interacts with the photopolymer, the microspheres will collapse, creating a relief. Different energy densities are employed to create either deep or shallow relief.

During the main laser collapse process, a "flash" or "bump" exposure is utilized throughout the plate to collapse a monolayer on the surface to form a denser layer and create the ultimate printing surface. The plate is then cured by a conventional face exposure and post-cured to hold 1% dots at 133 lines per inch (LPI).

TABLE 4

Formulation Scheme for Unexpanded or Expanded Microspheres Sensitive to 830 nm Lasers (Collapsible Layer)

| Ingredient | Weight % |
|---|---|
| Kraton ® D1102 | 57.37 |
| Shellflex ® 6371 | 21.19 |
| HDDA | 5.30 |
| TMPTMA | 5.30 |
| Irgacure ® 651 | 3.30 |
| BHT | 2.27 |
| Irganox ® 1010 | 0.03 |
| Calcium Stearate | 0.13 |
| Tinuvin ® 1130 | 0.01 |
| ADS830A dye | 0.10 |
| Expancel DU or DE Microspheres | 5.00 |
| | 100.0 |

EXAMPLE 2

Preparation of a Processless Flexographic Plate Using Unexpanded Microspheres Sensitive to 1064 nm Lasers A similar procedure to Example 1 is followed, using the composition listed in Table 5, where the microspheres are unexpanded microspheres (Expancel DU microspheres). The subsequent plate development and manufacture is the same as in Example 1, except for the plate-setter. A commercially available 1064 nm plate-setter such as Barco's CDI™ is used instead. The digital file from the computer is transferred onto the plate. In the areas where the laser interacts with the photopolymer, the microspheres collapse, creating a relief. Different energy densities are employed to create areas of deep and shallow relief.

During the main laser collapse step, a "flash" or "bump" exposure is used throughout to collapse a monolayer on the surface to form a denser layer and create the ultimate printing surface. The plate is cured by a conventional face exposure and post-cured to hold 1% dots at 133 lines per inch (LPI).

TABLE 5

Formulation Scheme for Unexpanded or Expanded Microspheres Sensitive to 1064 nm Lasers (Collapsible Layer)

| Ingredient | Weight % |
|---|---|
| Kraton ® D1102 | 57.37 |
| Shellflex ® 6371 | 21.19 |
| HDDA | 5.30 |
| TMPTMA | 5.30 |
| Irgacure ® 651 | 3.30 |
| BHT | 2.27 |
| Irganox ® 1010 | 0.03 |
| Calcium Stearate | 0.13 |
| Tinuvin ® 1130 | 0.01 |
| ADS1060A dye | 0.10 |
| Expancel DU or DE Microspheres | 5.00 |
| | 100.0 |

EXAMPLE 3

Preparation of a Processless Flexographic Plate Using Expanded Microspheres Sensitive to 830 nm Lasers A printing plate is manufactured according to the composition listed in Table 4, where the microspheres are expanded microspheres (Expancel DE microspheres). The ingredients are mixed in a Sigma mixer, and the compound is hot-pressed between 2 clear PETs, one of which has a slip film or release coating. Alternately, the plate is manufactured in a twin-screw extruder.

After lamination, the coversheet is removed and discarded. The plate is back-exposed through the backing, and mounted on a commercially available 830 nm flexographic plate-setter such as Creo's ThermoFlex® 5280. The digital file from the computer is transferred onto the plate. In the areas where the laser interacts with the photopolymer, the microspheres will collapse, creating a relief. Different energy densities are employed to create areas of deep and shallow relief.

During the main laser collapse step, a "flash" or "bump" exposure is used throughout the plate to collapse a monolayer on the surface to form a denser layer and create the ultimate printing surface. The plate is then cured by a conventional face exposure and post-cured to hold 1% dots at 133 lines per inch (LPI).

EXAMPLE 4

Preparation of a Processless Flexograpgic Plate Using Expanded Microspheres Sensitive to 1064 nm Lasers A similar procedure to Example 3 is used, except that the composition of Table 5 is used instead of the composition of Table 4, where the microspheres are expanded microspheres (Expancel DE microspheres). The subsequent plate development and manufacture are the same as before, except for the plate-setter. A commercially available 1064 nm plate-setter such as Barco's CDI™ is used instead. The digital file from the computer is transferred onto the plate. In the areas where the laser interacts with the photopolymer, the microspheres will collapse, creating a relief. Different energy densities are employed to create areas of deep and shallow relief.

During the main laser collapse process, a "flash" or "bump" exposure is used throughout to collapse a monolayer on the surface to form a denser layer and create the ultimate printing surface. The plate is then cured by a conventional face exposure and post-cured to hold 1% dots at 133 lines per inch (LPI).

EXAMPLE 5

Preparation of a Processless Flexographic Plate Using Unexpanded Microspheres Sensitive to 830 nm Lasers and Having a Non-collapsible Layer A printing plate having a collapsible bulk layer and a thin collapsible print layer is manufactured as follows.

The collapsible composition is listed in Table 4, using unexpanded microspheres (Expancel DU microspheres). The ingredients are mixed in a Sigma mixer, and the temperature of the mixer is slowly and gradually increased, until it reaches the "optimum" expansion temperature for the unexpanded microspheres to increase their volume. The optimum expansion temperature is determined through routine experimentation, and depends on the particular type and size of unexpanded microspheres that are used. Care is taken not to exceed the "maximum" expansion temperature so as to avoid microsphere collapse.

Alternately and preferably, the plate is manufactured in a twin-screw extruder. In the twin-screw extruder, the ingredients listed in Table 4 are partitioned into solids and pre-mixes. The solid and liquid streams are mixed initially at a temperature below the expansion temperature of the microspheres for complete mixing. The temperature of the barrel zones is gradually increased to create in situ expansion. The compound is then extruded and calendared to gage with the "non-collapsible" construction, as described below.

The "non-collapsible" print layer composition is listed in Table 6. The compound is mixed in a sigma mixer. Alternately, and preferably a twin-screw extruder can be employed to get the final compound. The compound is either hot pressed onto the PET having a thin slip coating (thickness~0.2 mils), or may be extruded directly onto the PET having the above slip coating to get the "non-collapsible" construction. The thickness of the non-collapsible layer is kept to about 2 mils.

Another way to get the "non-collapsible" construction is to use the traditional cap layer as taught in the literature and as used in MacDermid's Flexlight® EPIC plate. In this case the cap layer with the slip coating is toll manufactured and used just before the final plate manufacture as delineated below.

The final plate construction is arrived at by one of two methods. The collapsible compound from above is hot-pressed onto a backing PET and laminated to the above "non-collapsible" construction to get the final printing plate. Alternately, and preferably the collapsible layer could be extruded directly onto the backing PET and calendared to gage with the above "non-collapsible" construction.

The plate is back-exposed through the backing, the coversheet is removed and discarded, and the plate is then mounted on a commercially available 830 nm flexographic plate-setter such as Creo's ThermoFlex® 5280. The digital file from the computer is transferred onto the plate. In the areas where the laser interacts with the bulk photopolymer, the microspheres will collapse, creating a relief. The thin, "non-collapsible" layer is insensitive to the laser and will simply collapse with the underlying collapsible layer. Different energy densities are employed to create either deep or shallow relief. The plate is then cured by a conventional face exposure and post-cured to hold 1% dots at 133 lines per inch (LPI).

TABLE 6

Formulation Scheme for the Non-collapsible Layer

| Ingredient | Weight % |
| --- | --- |
| Kraton ® D1102 | 60.46 |
| Shellflex ® 6371 | 22.33 |
| HDDA | 5.58 |
| TMPTMA | 5.58 |
| Irgacure ® 651 | 3.48 |
| BHT | 2.39 |
| Irganox ® 1010 | 0.03 |
| Calcium Stearate | 0.14 |
| Tinuvin ® 1130 | 0.01 |
|  | 100.0 |

EXAMPLE 6

Preparation of a Processless Flexographic Plate Using Unexpanded Microspheres Sensitive to 1064 nm Lasers and Having a Non-collapsible Layer A procedure similar to Example 5 is followed, using the collapsible composition listed in Table 5, where the microspheres are unexpanded microspheres (Expancel DU microspheres). The "non-collapsible" composition is also identical to Example 5 and as listed in Table 6.

The subsequent plate development and manufacture is the same as in Example 5, except for the plate-setter. A commercially available 1064 nm plate-setter such as Barco's CDI™ is used instead. The digital file from the computer is transferred onto the plate. In the areas where the laser interacts with the photopolymer, the microspheres will collapse, creating a relief. The "non-collapsible" layer is insensitive to the laser and will simply collapse with the underlying collapsible layer. Different energy densities are employed to create either deep or shallow relief. The plate is then cured by a conventional face exposure and post-cured to hold 1% dots at 133 lines per inch (LPI).

COMPARATIVE EXAMPLE 7

Preparation of a Processless Flexographic Plate Using Laser Engraving with 830 nm Lasers A printing plate is manufactured using the composition listed in Table 7. As is apparent, this formula does not contain microspheres. The listed ingredients are mixed together in a Sigma mixer. The composition is then hot-pressed between 2 clear PETs, one of which has a slip film or release coating.

After lamination, the coversheet is removed and discarded. The plate is completely cured through using long UV face-exposure (FEX) times. The cured plate is mounted on a commercially available 830 nm flexographic plate-setter such as Creo's ThermoFlex® 5280. The digital file from the computer is transferred onto the plate. In the areas where the laser interacts with the photopolymer, the polymer will engrave, creating a relief. Much larger energy densities are needed to create deep relief. In order to achieve such high energy densities, the plate-setter needs to be run at extremely slow speeds. In addition, due to the heat generated, it is not possible to hold finer details.

TABLE 7

Formulation Scheme for a Processless Flexographic Plate Using Laser Engraving with 830 NM Lasers

| Ingredient | Weight % |
|---|---|
| Kraton ® D1102 | 60.39 |
| Shellflex ® 6371 | 22.31 |
| HDDA | 5.58 |
| TMPTMA | 5.58 |
| Irgacure ® 651 | 3.47 |
| BHT | 2.39 |
| Irganox ® 1010 | 0.03 |
| Calcium Stearate | 0.14 |
| Tinuvin ® 1130 | 0.01 |
| ADS830A dye | 0.10 |
|  | 100.0 |

COMPARATIVE EXAMPLE 8

Preparation of a Processless Flexographic Plate Using Laser Engraving with 1064 nm Lasers A printing plate is manufactured with the composition listed in Table 8. As is apparent, this formula does not contain microspheres. The listed ingredients are mixed together in a Sigma mixer. The composition is then hot-pressed between 2 clear PETs, one of which has a slip film or release coating.

After lamination, the coversheet is removed and discarded. The plate is completely cured through using long UV face exposure (FEX) times. The cured plate is mounted on a commercially available 1064 NM plate-setter such as Barco's CDI™. The digital file from the computer is transferred onto the plate. In the areas where the laser interacts with the photopolymer, the polymer will engrave, creating a relief. Much larger energy densities are needed to create deep relief. In order to achieve such high energy densities, the plate-setter needs to run at extremely slow speeds. Also, due to the heat generated, it is not possible to hold finer details.

TABLE 8

Formulation Scheme for a Processless Flexographic Plate Using Laser Engraving with 1064 nm Lasers

| Ingredient | Weight % |
|---|---|
| Kraton D1102 | 60.39 |
| Shellflex 6371 | 22.31 |
| HDDA | 5.58 |
| TMPTMA | 5.58 |
| Irgacure 651 | 3.47 |
| BHT | 2.39 |
| Irganox 1010 | 0.03 |
| Calcium Stearate | 0.14 |
| Tinuvin 1130 | 0.01 |
| ADS1060A | 0.10 |
|  | 100.0 |

What is claimed is:

1. A method of making a digitally imaged relief-printing plate comprising the steps of:
   a) extruding a collapsible UV-curable layer comprising (i) a UV-curable elastonier, (ii) an infrared dye, and (iii) microspheres, between a cover sheet and a backing sheet to form a printing plate;
   b) exposing the collapsible UV-curable layer through the backing sheet to establish a floor layer;
   c) removing the cover sheet from the printing plate;
   d) using a laser to collapse and melt portions of the collapsible UV-curable layer to form a relief image on the printing place; and
   e) UV-curing said UV-curable layer by face exposure to crosslink and cure said formed relief image.

2. A method according to claim 1, wherein said printing plate further comprises a thin layer of non-collapsible UV-curable elastomer between the collapsible UV-curable layer and the cover sheet of the plate.

3. A method according to claim 1, wherein as the relief image is formed on the printing plate, the printing plate is simultaneously bump-exposed, to collapse at least a portion ox said collapsible UV-curable layer to create a final printing surface on said printing plate.

4. A method according to claim 1, further comprising a step of laser collapsing at least a portion of said formed image to form a denser printing surface.

5. A method according to claim 1, wherein the backing sheet comprises polyethylene terephthalate.

6. A method according to claim 1, wherein the cover sheet further comprises a slip film or a release layer.

7. A method according to claim 1, wherein the UV-curable elastomer composition comprises a binder, a plasticizer, a UV-curable monomer, and a photoinitiator.

8. A method according to claim 7, wherein said binder is a styrene-diene-styrene triblock copolymer.

9. A method according to claim 7, wherein the UV-curable monomer is selected from the group consisting of difunctional and trifunctional acrylates.

10. A method according to claim 7, wherein the photoinitiator is selected from the group consisting of benzoin alkyl ethers, dialkoxyacetophenones, aldehyde and ketone carbonyl compounds having at least one aromatic nucleus attached directly to the carboxyl group, and phosphines.

11. A method according to claim 1, wherein the microspheres are selected from the group consisting of expanded microspheres and unexpanded microspheres.

12. A method according to claim 11, wherein said unexpanded microspheres have an initial particle size of 6–16 µm and a particle size upon expansion of 20–40 µm, with a corresponding change in density from about 0.8 to 1.1 g/cm$^3$ to between about 0.02 and about 0.06 g/cm$^3$.

13. A method according to claim 11, wherein said microspheres are unexpanded microspheres and the collapsible UV-curable elastomer composition is first mixed at a temperature below the expansion temperature of said unexpanded microspheres and the temperature is then gradually increased to facilitate expansion of the microspheres.

14. A method according to claim 11, wherein said unexpanded particles have a starting temperature, prior to expansion, of about 199° F. to about 252° F., based on the particle size of the microspheres.

15. A method according to claim 11, wherein said unexpanded particles have a maximum temperature of expansion of about 264° F. to about 379° F., based on the particle size of the microspheres.

16. A method according to claim 11, wherein said expanded microspheres comprise a thermoplastic shell encapsulating a hydrocarbon.

17. A method according to claim 1, wherein the collapsible UV-curable elastomer composition comprises about 1% to about 15%, by weight, of the microspheres.

18. A method according to claim 1, wherein the collapsible UV-curable elastomer layer comprises about 0.01 to about 5 percent, by weight, of the infrared dye.

19. A method according to claim 1, wherein said laser is a plate setter infrared laser operating at a wavelength of 830 nanometers or 1064 nanometers.

20. A method according to claim 19, wherein the infrared dye is selected based on the operating wavelength of the plate-setter laser.

21. A method according to claim 19, wherein the infrared dye is UV-transmissive at wavelengths between 350 and 400 nanometers.

22. A method according to claim 1, wherein the infrared dye is UV-transmissive at wavelengths between 350 and 400 nanometers.

23. A method according to claim 1, wherein the laser is an IR-laser that uses different energy densities to create areas of different depths on the relief image.

24. A method according to claim 1, further comprising a step of post curing and detacking said printing plate to hold 1 percent dots at 133 LPI.

25. A digitally imaged relief-printing plate made by the method of claim 1.

26. A digitally imaged relief-printing plate comprising:
   a collapsible UV-curable layer comprising: (i) a UV-curable elastomer, (ii) an infrared dye, and (iii) microspheres;
   wherein the printing plate comprises a relief image formed from selectively collapsed and melted portions of the collapsible UV-curable layer; and
   wherein the printing plate is UV-cured to cross-link and cure said relief image.

27. A printing plate according to claim 26, wherein said printing plate further comprises a thin layer of non-collapsible UV-curable elastomer.

28. A printing plate according to claim 26, further comprising a collapsed top layer of the collapsible UV-curable layer, creating a denser printing surface.

29. A printing plate according to claim 26, wherein an IR-laser is used to produce said selected collapsed and melted portions of the collapsible UV-curable layer.

30. A printing plate according to claim 29, wherein said infrared dye is selected based on the operating wavelength of said IR-laser.

31. A printing plate according to claim 30, wherein the infrared dye is UV-transmissive at wavelengths between 350 and 400 nanometers.

32. A printing plate according to claim 29, wherein the IR-laser uses different energy densities to create areas of different depths on the relief image.

33. A printing plate according to claim 26, wherein said printing plate comprises a backing sheet comprising polyethylene terephthalate.

34. A printing plate according to claim 26, wherein the printing plate comprises a coversheet comprising a slip film or a release layer.

35. A printing plate according to claim 26, wherein the UV-curable elastomer of the collapsible UV-curable layer comprises a binder, a plasticizer, UV-curable monomer, and a photoinitiator.

36. A printing plate according to claim 35, wherein said binder is a styrene-diene-styrene triblock copolymer.

37. A printing plate according to claim 35, wherein the UV-curable monomer is selected from the group consisting of difunctional and trifunctional acrylates.

38. A printing plate according to claim 35, wherein the photo-initiator is selected from the group consisting of benzoin alkyl ethers, dialkoxyacetophenones, aldehyde and ketone carbonyl compounds having at least one aromatic nucleus attached directly to the carboxyl group, and phosphines.

39. A printing plate according to claim 26, wherein the microspheres are selected from the group consisting of expanded microspheres and unexpanded microspheres.

40. A printing plate according to claim 39, wherein said unexpanded microspheres have an initial particle size of 6–16 $\mu$m and a particle size upon expansion of 20–'$\mu$m, with a corresponding change in density from about 0.8 to 1.1 g/cm$^3$ to between about 0.02 and about 0.06 g/cm$^3$.

41. A printing plate according to claim 39, wherein said microspheres are unexpanded microspheres and the collapsible UV-curable layer is first mixed at a temperature below the expansion temperature of said unexpanded microspheres and the temperature is then gradually increased to facilitate expansion of the microspheres.

42. A printing according to claim 39, wherein said unexpanded particles have a starting temperature, prior to expansion, of about 199° F. to about 252° F., based on the particle size of the microspheres.

43. A printing plate according to claim 39, wherein said unexpanded particles have a maximum temperature of expansion of about 264° F. to about 379° F., based on the particle size of the microspheres.

44. A printing plate according to claim 39, wherein said expanded microspheres comprises a thermoplastic shell encapsulating a hydrocarbon.

45. A printing plate according to claim 26, wherein the collapsible UV-curable elastomer layer comprises about 5% to about 15%, by weight, of the microspheres.

46. A printing plate according to claim 26, wherein the collapsible UV-curable layer comprises about 0.01 to about 5 percent, by weight, of the infrared dye.

47. A printing plate according to claim 26, wherein the infrared dye is UV-transmissive at wavelength between 350 and 400 nanometers.

48. A printing plate according to claim 26, wherein said printing plate is further post cured and detacked to hold 1 percent dots at 133 LPI.

* * * * *

UNITED STATES PATENT AND TRADEMARK OFFICE
CERTIFICATE OF CORRECTION

PATENT NO. : 6,806,018 B2
DATED : October 19, 2004
INVENTOR(S) : Rustom Sam Kanga et al.

It is certified that error appears in the above-identified patent and that said Letters Patent is hereby corrected as shown below:

Column 15,
Line 62, between "UV-curable" and "(ii) an infrared," delete the word "elastonier," and replace it with -- elastomer, --

Column 16,
Line 3, between "printing" and "and" delete the word "place;" and replace it with
-- plate; --
Line 13, between "portion" and "said" delete the word "ox" and replace it with -- of --
Line 22, between "elastomer" and "comprises" delete the word "composition" and replace it with -- of the collapsible UV-curable layer --

Column 17,
Line 46, between "wherein" and "printing" delete the word "said" and replace it with
-- the --

Column 18,
Line 19, between "expansion of" and "with a corresponding" delete the word "20-μm," and replace it with -- 20-40 μm, --

Signed and Sealed this

Twenty-eighth Day of December, 2004

JON W. DUDAS
*Director of the United States Patent and Trademark Office*